United States Patent
Mizuta et al.

(10) Patent No.: US 10,118,322 B2
(45) Date of Patent: Nov. 6, 2018

(54) SHEET-SHAPED MOLD, PRODUCTION METHOD THEREFOR, AND APPLICATION THEREFOR

(71) Applicant: DAICEL CORPORATION, Osaka-shi, Osaka (JP)

(72) Inventors: Tomoya Mizuta, Himeji (JP); Takuya Osaka, Himeji (JP); Katsuhiro Nakaguchi, Himeji (JP); Arimichi Okumura, Himeji (JP); Hiroto Miyake, Tokyo (JP); Masaya Omura, Himeji (JP); Naotaka Nishio, Himeji (JP)

(73) Assignee: DAICEL CORPORATION, Osaka-shi (JP)

( * ) Notice: Subject to any disclaimer, the term of this patent is extended or adjusted under 35 U.S.C. 154(b) by 422 days.

(21) Appl. No.: 14/764,095

(22) PCT Filed: Jan. 27, 2014

(86) PCT No.: PCT/JP2014/051673
§ 371 (c)(1),
(2) Date: Jul. 28, 2015

(87) PCT Pub. No.: WO2014/119514
PCT Pub. Date: Aug. 7, 2014

(65) Prior Publication Data
US 2016/0009006 A1    Jan. 14, 2016

(30) Foreign Application Priority Data

Jan. 29, 2013  (JP) ................................. 2013-014358
Aug. 9, 2013   (JP) ................................. 2013-165966

(51) Int. Cl.
B29C 43/36    (2006.01)
B29C 33/00    (2006.01)
(Continued)

(52) U.S. Cl.
CPC .......... *B29C 43/36* (2013.01); *B29C 33/0011* (2013.01); *B29C 33/405* (2013.01);
(Continued)

(58) Field of Classification Search
CPC ....................................... B29C 43/36
See application file for complete search history.

(56) References Cited

U.S. PATENT DOCUMENTS 3,542,900 A  *  11/1970  Lammers .............. B29C 33/405
                                                    249/134
4,726,412 A      2/1988  Magnan et al.
(Continued)

FOREIGN PATENT DOCUMENTS

CN    102791454 A    11/2012
JP       51-1739 B     1/1976
(Continued)

OTHER PUBLICATIONS

Japanese Office Action for Japanese Application No. 2013-014358, dated Jun. 21, 2016, with an English translation.
(Continued)

*Primary Examiner* — Larry W Thrower
(74) *Attorney, Agent, or Firm* — Birch, Stewart, Kolasch & Birch, LLP (57) ABSTRACT

Provided is a sheet-shaped mold possessing a high strength and having a low breakage rate in demolding even in a case where the mold is thin and has a large-area. The sheet-shaped mold is prepared by combining a cured silicone rubber containing a polyorganosiloxane and a fiber for reinforcing the cured silicone rubber. The fiber may comprise a cellulose nanofiber. The sheet-shaped mold may have an uneven pattern on at least one surface (or side) thereof. The fiber may be surface-treated with a hydrophobizing agent. The fiber may form a nonwoven fabric, and the
(Continued)

nonwoven fabric may be impregnated with the cured silicone rubber. The cured silicone rubber may comprise a two-component curable silicone rubber having a polydimethylsiloxane unit. The sheet-shaped mold may be a mold for nanoimprint lithography using a photo-curable resin.

8 Claims, 1 Drawing Sheet

(51) Int. Cl.
  B81C 99/00 (2010.01)
  B29C 43/02 (2006.01)
  B29C 59/02 (2006.01)
  C08L 83/04 (2006.01)
  G03F 7/00 (2006.01)
  B29C 33/40 (2006.01)
  B29L 31/00 (2006.01)
  B29C 33/42 (2006.01)
(52) U.S. Cl.
  CPC .......... *B29C 43/021* (2013.01); *B29C 59/022* (2013.01); *B29C 59/026* (2013.01); *B81C 99/009* (2013.01); *C08L 83/04* (2013.01); *G03F 7/0002* (2013.01); *B29C 33/424* (2013.01); *B29K 2883/00* (2013.01); *B29K 2913/00* (2013.01); *B29L 2031/757* (2013.01)

(56) References Cited

U.S. PATENT DOCUMENTS

| | | |
|---|---|---|
| 2006/0290025 A1 | 12/2006 | Chae et al. |
| 2008/0138525 A1 | 6/2008 | Bailey et al. |
| 2008/0251191 A1* | 10/2008 | Schafer .................. B29C 33/42 156/242 |
| 2010/0200146 A1 | 8/2010 | Zhu et al. |

FOREIGN PATENT DOCUMENTS

| | | |
|---|---|---|
| JP | 51-26446 B | 8/1976 |
| JP | 51-111862 A | 10/1976 |
| JP | 58-151248 A | 9/1983 |
| JP | 61-089380 A | 5/1986 |
| JP | 61-261356 A | 11/1986 |
| JP | 62-111720 A | 5/1987 |
| JP | 2002-160266 A | 6/2002 |
| JP | 2002-212310 A | 7/2002 |
| JP | 2007-001288 A | 1/2007 |
| JP | 2007-146143 A | 6/2007 |
| JP | 2008-531345 A | 8/2008 |
| JP | 2010-179586 A | 8/2010 |
| JP | 2011-084071 A | 4/2011 |
| WO | WO 2007/099907 A1 | 9/2007 |

OTHER PUBLICATIONS

Anonymous, "Nanocellulose," Wikipedia, the free encyclopedia, Oct. 5, 2012, pp. 1-11, XP055301246.
Database WPI Week 197646, Thomson Scientific, London, GB; AN 1976-86165X, XP002761642, 1976, 1 page.
Database WPI Week 198701; 199339, Thomson Scientific, London, GB; AN 1987-002620, XP002761641, 1987, 1 page.
Database WPI Week 201057, Thomson Scientific, London, GB; AN 2010-K58384, XP002761643, 2010, 2 pages.
Extended European Search Report for European Application No. 14745457.3, dated Sep. 21, 2016.
Translation of Written Opinion of the International Searching Authority dated Aug. 13, 2015, issued in PCT/JP2014/051673 (Forms PCT/IB/338, PCT/ISA/237 and PCT/IB/373).
Chinese Office Action dated Jun. 7, 2016, issued in corresponding Chinese Patent Application No. 201480017571.4.
International Search report issued in PCT/JP2014/051673 dated Apr. 22, 2014.

* cited by examiner

SHEET-SHAPED MOLD, PRODUCTION METHOD THEREFOR, AND APPLICATION THEREFOR

TECHNICAL FIELD

The present invention relates to sheet-shaped molds containing silicone rubbers and fibers. The present invention also relates to processes for producing the same and applications therefor.

BACKGROUND ART

In processes for producing semiconductors or optical materials, patterning techniques that form fine patterns (or micropatterns) using molds are now attracting much attention. As the patterning techniques, various methods are known, such as soft lithography, capillary force lithography, and imprint lithography. For example, the imprint lithography comprises transferring an uneven pattern formed on a mold to an imprinting resin (or a resin for imprint) by stamping to easily produce a resin structure having the uneven pattern.

For a process for producing a fine structure by nanoimprinting, a mold to be used includes a quartz glass mold, a nickel mold, and others. Generally, such a mold is hard to be released from a resin, and the mold is used after a mold release agent is applied to the surface of the mold. Meanwhile, a mold made of a silicone rubber has a high transparency and is easily detached from an imprinting resin, and the imprinting resin can be photo-cured with the mold stamped thereon. Thereafter, the cured imprinting resin can easily be released from the mold. In particular, since a curable silicone rubber having a polydimethylsiloxane (PDMS) unit is easy to harden and easy to obtain, a cured product (a silicone rubber) of the curable silicone rubber is being widely used as a material for forming a mold.

Unfortunately, the PDMS cured product has a low mechanical strength (such as Young's modulus or modulus of elasticity in tension), and a large-area mold made of the PDMS cured product is sometimes damaged (or broken) in releasing the imprinting resin from the mold. Thus, since a large-area mold made of the PDMS needs to have a sufficient thickness in order to ensure a mechanical strength necessary for handling, the production of the mold needs a large amount of the PDMS. A problem of the mold is a serious increase in the production cost. Accordingly, a thin mold having a high mechanical strength is needed.

Japanese Patent Application Laid-Open Publication No. 2007-1288 (JP-2007-1288A, Patent Document 1) discloses a soft mold comprising a support film and a mold surrounding the support film. The support film has a high UV transmittance and comprises two-way sheets, and the mold has an uneven pattern on a surface thereof. This document discloses a poly(ethylene terephthalate) (PET) film as the support film, and a mold composed of a PDMS cured product as the mold. According to this document, the soft mold as a thin film formed by surrounding the transparent film as a core material with the PDMS cured product has a reduced thickness while maintaining a mechanical strength thereof.

However, according to this document, due to a low adhesion strength between the support film and the PDMS cured product, repeated use causes separation of the support film from the PDMS cured product. Moreover, in a case where the support film has a large area, the support film less follows a curved surface. Further, the PET film as the support film is unfortunately easily deformable due to a low heat resistance.

Japanese Patent Application Laid-Open Publication No. 2007-146143 (JP-2007-146143A, Patent Document 2) discloses a transparent fiber-reinforced composite resin composition, as a resin composition used for a sealant, adhesive, or filler, comprising a cellulose fiber having an average fiber diameter of 4 to 200 nm and a liquid precursor of a matrix resin. This document discloses that the matrix resin preferably includes highly transparent acrylic resin, methacrylic resin, epoxy resin, and silicone resin. In Examples of this document, water in an aqueous suspension of a hydrated bacterial cellulose is replaced with a gel-formed silicone resin (TSE3051 manufactured by GE Toshiba Silicone) to prepare a fiber-reinforced composite resin composition having a fiber content of 10% and a cured product thereof.

However, this document does not disclose use of the fiber-reinforced composite resin composition as a mold having a fine uneven pattern or does not disclose details of the silicone resin. Moreover, the silicone resin used in Examples is a silicone compound having a low modulus of elasticity, what is called a silicone gel. The silicone gel is hard to handle and unsuitable as a material for a mold.

RELATED ART DOCUMENTS

Patent Documents

Patent Document 1: JP-2007-1288A (Claims)
Patent Document 2: JP-2007-146143A (claim 1, paragraph [0086], and Examples)

SUMMARY OF THE INVENTION

Problems to be Solved by the Invention

It is therefore an object of the present invention to provide a sheet-shaped mold possessing a high strength and having a low breakage rate in demolding even in a case where the mold is thin and has a large area, and to provide a process for producing the mold.

Another object of the present invention is to provide a sheet-shaped mold having a low coefficient of linear expansion and a fine pattern hardly deformable to temperature change, and to provide a process for producing the mold.

It is still another object of the present invention to provide a sheet-shaped mold having an excellent transparency and a high ultraviolet transmission, and to provide a process for producing the mold.

It is a further object of the present invention to provide a method for transferring a fine pattern on a large-area object to be imprinted by using a sheet-shaped mold, and to provide an object having a fine pattern transferred by the method.

Means to Solve the Problems

The inventors of the present invention made intensive studies to achieve the above objects and finally found that a sheet-shaped mold having an uneven pattern formed on a surface thereof and containing a cured silicone rubber reinforced with a fiber has a high strength and a low breakage rate in demolding even in a case where the mold is thin and has a large area. The present invention was accomplished based on the above findings.

That is, an aspect of the present invention provides a sheet-shaped mold that comprises a cured silicone rubber containing a polyorganosiloxane (or a cured silicone rubber obtainable from a polyorganosiloxane) and a fiber for reinforcing the cured silicone rubber. The fiber may comprise a cellulose nanofiber. The sheet-shaped mold may have an uneven pattern on at least one surface (or side) thereof. The fiber may be surface-treated with a hydrophobizing agent (in particular, a silane coupling agent). The fiber may form a nonwoven fabric, and the nonwoven fabric may be impregnated with the cured silicone rubber. The cured silicone rubber may comprise a two-component curable silicone rubber having a polydimethylsiloxane unit (or a cured product of the two-component curable silicone rubber). The uneven pattern may comprise a bump (or a protrusion) and a dent (or a recess or a depression), the bump may have an average height of 50 nm to 100 μm, and the bump or dent may have a minimum width of 50 nm to 100 μm. The sheet-shaped mold may be a mold (or a transfer mold) for nanoimprint lithography using a photo-curable resin (for example, a photocationic-curable resin).

Another aspect of the present invention provides a process for producing a sheet-shaped mold comprising: a sheet-forming step of forming a compound comprising a fiber and a curable silicone rubber composition having a polyorganosiloxane unit into a sheet (an uncured composite sheet) and a curing step of curing the curable silicone rubber composition to give a composite sheet comprising the fiber and a cured product of the curable silicone rubber composition. The process for producing the sheet-shaped mold may comprise a pattern-forming step of forming an objective pattern on a surface (or a side) of the uncured composite sheet using a base mold (a master mold). The sheet-forming step may comprise impregnating a nonwoven fabric obtained from the fiber with the curable silicone rubber composition. In the pattern-forming step, the master mold may be obtainable by using a mold smaller than the master mold so as to have a pattern repeatedly transferred closely in lengthwise and crosswise directions.

A further aspect of the present invention provides a method for transferring an objective pattern on an object (or an object to be transferred) by using the sheet-shaped mold as a mold.

Effects of the Invention

The sheet-shaped mold according to the present invention, which comprises a cured silicone rubber and a fiber in combination, has a high strength and a low breakage rate in demolding in a case where the mold is thin and has a large area. Moreover, the mold has a low coefficient of linear expansion and a fine pattern hardly deformable to (or depending on) temperature change. Further, the mold has an excellent transparency and a high ultraviolet transmission. Furthermore, use of the sheet-shaped mold allows transferring of an uneven pattern with a high precision even in a case where an object to be imprinted by the sheet-shaped mold has a large area.

DESCRIPTION OF EMBODIMENTS

Sheet-Shaped Mold

The sheet-shaped mold of the present invention comprises a cured silicone rubber containing a polyorganosiloxane, and a fiber.

(Fiber)

The fiber may be an inorganic fiber. In light of easy preparation or others, an organic fiber is preferred. The organic fiber may include a natural fiber (for example, a cellulose, a silk, and a wool fiber), a regenerated fiber (for example, a protein or polypeptide fiber, and an alginic acid fiber), a bituminous coal fiber (such as a pitch-based fiber), a synthetic fiber (such as a thermosetting resin fiber or a thermoplastic resin fiber), and others. Among them, the cellulose fiber, which has a low coefficient of linear expansion and is stable to temperature change, is preferred.

The cellulose fiber is not particularly limited to a specific one as far as the cellulose fiber comprises a polysaccharide having a β-1,4-glucan structure. The cellulose fiber may include a cellulose fiber derived from a higher plant [for example, a natural cellulose fiber (pulp fiber), such as a wood fiber (e.g., a wood pulp made from a coniferous tree or a broad-leaved tree), a bamboo fiber, a sugar cane fiber, a seed-hair fiber (such as a cotton linter, a bombax cotton, or a kapok), a bast fiber (e.g., a hemp, a kozo (a paper mulberry), and a mitsumata plant (an oriental paperbush)), or a leaf fiber (e.g., a Manila hemp and a New Zealand flax)], a cellulose fiber derived from an animal (such as a tunicate (or ascidian) cellulose), a cellulose fiber derived from a bacterium, and a chemically synthesized cellulose fiber [e.g., a cellulose derivative, such as an organic acid ester of a cellulose (such as a cellulose acetate (an acetyl cellulose), a cellulose propionate, a cellulose butyrate, a cellulose acetate propionate, or a cellulose acetate butyrate); an inorganic acid ester of a cellulose (such as a cellulose nitrate, a cellulose sulfate, or a cellulose phosphate); a mixed acid ester of a cellulose (such as a cellulose nitrate sulfate); a hydroxyalkyl cellulose (e.g., a hydroxyethyl cellulose (HEC) and a hydroxypropyl cellulose); a carboxyalkyl cellulose (such as a carboxymethyl cellulose (CMC) or a carboxyethyl cellulose); an alkyl cellulose (such as a methyl cellulose or an ethyl cellulose); or a regenerated cellulose (such as a rayon or a cellophane)]. These cellulose fibers may be used alone or in combination.

The cellulose fiber may be a highly pure cellulose having a high α-cellulose content according to purposes. For example, the cellulose fiber may have an α-cellulose content of about 70 to 100% by weight (e.g., about 95 to 100% by weight) and preferably about 98 to 100% by weight. Further, a highly pure cellulose having a low lignin or hemicellulose content allows preparation of a fine cellulose fiber having a nanometer size and a uniform fiber diameter even in a case where the cellulose is a wood fiber or a seed-hair fiber. In particular, the cellulose having a low lignin or hemicellulose content may have a Kappa number (κ number) of not more than 30 (e.g., about 0 to 30), preferably about 0 to 20, and more preferably about 0 to 10 (particularly about 0 to 5). The Kappa number can be measured in accordance with Japanese Industrial Standards (JIS) P8211 "Pulps—Determination of Kappa number".

Among these cellulose fibers, in light of high productivity and moderate fiber diameter or fiber length, a preferred cellulose fiber includes a cellulose fiber derived from a plant, for example, a fine cellulose fiber derived from a pulp, such as a wood fiber (e.g., a wood pulp made from a coniferous tree or a broad-leaved tree) or a seed-hair fiber (e.g., a cotton linter pulp). The pulp may a pulp obtained by a mechanical process (e.g., a groundwood pulp, a refiner groundwood pulp, a thermomechanical pulp, a semi-chemical pulp, and a chemigroundwood pulp), a pulp obtained by a chemical process (e.g., a kraft pulp and a sulfite pulp), and others. If necessary, the pulp may be a beaten (pre-beaten) fiber (e.g., a beaten pulp) as described later. The cellulose fiber may be a fiber that has been subjected to a usual purification treatment, for example, a degreasing treatment (e.g., an absorbent cotton). In a case where a nanometer-sized fine cellulose fiber is prepared by microfibrillation, a never-dried pulp, that is, a pulp having no history of drying (a pulp in a wet state without drying), is particularly preferred from the point of view of reducing entanglement of raw fibers, achieving efficient microfibrillation by homogenization, and obtaining fine fibers of uniform nanometer size. The never-dried pulp is composed of a wood fiber and/or a seed-hair fiber and may have a Kappa number of not more than 30 (particularly about 0 to 10). The pulp may be prepared by bleaching a wood fiber and/or a seed-hair fiber with chlorine.

The cross-sectional form of the fiber (the form of the cross section perpendicular to the longitudinal direction of the fiber) is not particularly limited to a specific one. In a case where the fiber is a cellulose fiber, the cross-sectional form of the cellulose fiber may be an anisotropic form (a flat form), like that of a bacterial cellulose. For a cellulose fiber derived from a plant, the cross-sectional form of the cellulose fiber is preferably a substantially isotropic form. The substantially isotropic form may include, for example, a substantially perfect circular form and a substantially regular polygonal form. For the substantially circular form, the cross-sectional form has a ratio of a longer diameter relative to a shorter diameter (an average aspect ratio) of, for example, about 1 to 2, preferably about 1 to 1.5, and more preferably about 1 to 1.3 (particularly about 1 to 1.2).

The fiber (in particular, the cellulose fiber) may have any fiber diameter as far as the fiber has an average fiber diameter of not more than 10 μm. For example, the average fiber diameter can be selected from the range of about 4 nm to 10 μm (e.g., about 5 nm to 5 μm). In order to make the sheet-shaped mold thinner and improve the transparency of the sheet-shaped mold, a nanometer-sized fine fiber (a nanofiber) is preferred. In particular, in a case where the fiber is a cellulose fiber, a preferred fiber includes a fine cellulose fiber (cellulose nanofiber) obtainable by microfibrillating a raw cellulose fiber derived from a plant.

The fine fiber (in particular, the fine cellulose fiber) may have an average fiber diameter selected from the range of about 10 to 1000 nm. For example, the fine fiber has an average fiber diameter of about 10 to 800 nm, preferably about 15 to 500 nm, and more preferably about 20 to 300 nm (particularly about 25 to 100 nm).

The fine fiber (in particular, the fine cellulose fiber) may have a maximum fiber diameter of not more than 2 μm (e.g., about 20 to 2000 nm), for example, about 20 to 1000 nm, preferably about 30 to 500 nm, and more preferably about 40 to 300 nm (particularly about 50 to 100 nm). The fine fiber has a standard deviation of fiber diameter distribution of, for example, not more than 1 μm (e.g., about 5 to 1000 nm), preferably about 10 to 500 nm, and more preferably about 10 to 100 nm.

In the present invention, the average fiber diameter, the standard deviation of fiber diameter distribution, and the maximum fiber diameter are calculated based on fiber diameters (n=about 20) measured on an electron micrograph.

The fine fiber (in particular, the fine cellulose fiber) is usually obtainable by microfibrillating a raw fiber (in particular, a cellulose fiber). The microfibrillation may comprise a step of dispersing a raw fiber in a solvent to prepare a dispersion (a dispersion preparation step) and a step of microfibrillating the dispersion (a microfibrillation step).

The raw fiber has an average fiber length of, for example, about 0.01 to 5 mm, preferably about 0.03 to 4 mm, more preferably about 0.06 to 3 mm (particularly about 0.1 to 2 mm), and usually about 0.1 to 5 mm. The raw fiber has an average fiber diameter of about 0.01 to 500 μm, preferably about 0.05 to 400 μm, and more preferably about 0.1 to 300 μm (particularly about 0.2 to 250 μm).

The solvent is not particularly limited to a specific one as far as the solvent does not chemically or physically damage the raw fiber. For example, the solvent may include water and an organic solvent [for example, an alcohol (e.g., a $C_{1-4}$alkanol, such as methanol, ethanol, 1-propanol, or isopropanol), an ether (e.g., a $diC_{1-4}$alkyl ether, such as diethyl ether or diisopropyl ether, and a circular ether, such as tetrahydrofuran (e.g., a circular $C_{4-6}$ether)), an ester (an ester of an alkanoic acid, such as ethyl acetate), a ketone (e.g., a $diC_{1-5}$alkyl ketone, such as acetone, methyl ethyl ketone, or methyl butyl ketone, and a $C_{4-10}$ cycloalkanone, such as cyclohexanone), an aromatic hydrocarbon (such as toluene or xylene), and a halogenated hydrocarbon (such as methyl chloride or methyl fluoride)].

These solvents may be used alone or in combination. Among these solvents, in light of efficient fiber production and cost saving of fiber production, water is preferred. If necessary, a mixed solvent containing water and a hydrophilic organic solvent (such as a $C_{1-4}$alkanol or acetone) may be used. In particular, the fine cellulose fiber can be produced environment-friendly with a high productivity by using water as the solvent without a step of replacing the solvent with an organic solvent.

The raw fiber to be subjected to the microfibrillation step may be any raw fiber as far as the raw fiber at least exists in the solvent. Prior to the microfibrillation, the raw fiber may be dispersed (or suspended) in the solvent. The raw fiber may be dispersed by, for example, a usual disperser (such as an ultrasonic disperser, a homodisper (a homogenizing disperser), or a three-one motor). The disperser may be provided with a mechanically stirring means (such as a stirring rod or a stirring bar).

The concentration of the raw fiber in the solvent may be, for example, about 0.01 to 20% by weight, preferably about 0.05 to 10% by weight, and more preferably about 0.1 to 5% by weight (particularly about 0.5 to 3% by weight).

In the microfibrillation step, the raw fiber can be microfibrillated by subjecting the dispersion (or dispersion liquid) to a usual method (such as a beating (or refining) treatment or a homogenization treatment). For the beating treatment, there may be used a conventional beating machine, for example, a beater, a Jordan, a conical refiner, a single disc refiner, and a double disc refiner. For the homogenization treatment, there may be used a conventional homogenizing apparatus, for example, a homogenizer (in particular, a high-pressure homogenizer). If necessary, the dispersion may be subjected to the homogenization treatment after the dispersion is subjected to the beating (pre-beating) treatment by the above-mentioned method. Moreover, for the homogenization treatment, there may be used methods as described in Japanese Examined Patent Application Publication No. 60-19921 and Japanese Patent Application Laid-Open Publication Nos. 2011-26760, 2012-25833, 2012-36517, and 2012-36518. In particular, for the production of a nanofiber having a fiber diameter of about not more than 100 nm, the homogenization treatment may be carried out using a homogenizer provided with a crushing-type homovalve sheet, among the methods described in Japanese Patent Application Laid-Open Publication Nos. 2011-26760, 2012-25833, 2012-36517, and 2012-36518.

The average fiber length of the fiber (in particular, the fine cellulose fiber) is not particularly limited to a specific one.

The fiber may be a continuous fiber. For the microfibrillated fiber, the average fiber length can be selected from the range of about 10 to 3000 μm. In order to improve the mechanical characteristics of the sheet-shaped mold of the present invention, the average fiber length may be, for example, about 100 to 1000 μm, preferably about 200 to 800 and more preferably about 300 to 700 μm (particularly about 400 to 600 μm). Further, the fiber may have a ratio of an average fiber length relative to an average fiber diameter (average fiber length/average fiber diameter) (an average aspect ratio) of not less than 300, for example, not less than 500 (e.g., about 500 to 10000), preferably about 800 to 5000, and more preferably about 1000 to 3000 (particularly about 1500 to 2000). As described later, the fiber may be formed into a nonwoven fabric.

The fiber (in particular, the fine cellulose fiber) may surface-treated with a hydrophobizing agent in order to improve the adhesion to a silicone rubber. The hydrophobizing agent is not particularly limited to a specific one as far as the hydrophobizing agent can make the surface of the fiber hydrophobic. As the hydrophobizing agent, various coupling agents may be used. In light of the affinity for a silicone rubber, or other respects, a silane coupling agent is preferred.

The silane coupling agent may include, for example, an alkoxysilyl group-containing silane coupling agent [e.g., a tetraC$_{1-4}$alkoxysilane (such as tetramethoxysilane or tetraethoxysilane), a C$_{1-12}$alkyltriC$_{1-4}$alkoxysilane (such as methyltrimethoxysilane or octyltriethoxysilane), a diC$_{2-4}$alkyldiC$_{1-4}$alkoxysilane (such as dimethyldimethoxysilane), and an arylC$_{1-4}$alkoxysilane (such as phenyltrimethoxysilane or diphenyldimethoxysilane)], a halogen-containing silane coupling agent [e.g., a trifluoroC$_{2-4}$ alkyltriC$_{1-4}$alkoxysilane (such as trifluoropropyltrimethoxysilane), a perfluoroalkylC$_{2-4}$alkyltriC$_{1-4}$alkoxysilane (such as perfluorooctylethyltrimethoxysilane), a chloroC$_{2-4}$alkyltriC$_{1-4}$alkoxysilane (such as 2-chloroethyltrimethoxysilane), and a C$_{1-4}$alkyltrichlorosilane (such as methyltrichlorosilane)], a vinyl group-containing silane coupling agent (e.g., a vinyltriC$_{1-4}$alkoxysilane, such as vinyltrimethoxysilane), an ethylenic unsaturated bond group-containing silane coupling agent [e.g., a (meth)acryloxyC$_{2-4}$alkylC$_{1-4}$alkoxysilane (such as 2-(meth)acryloxyethyltrimethoxysilane or 3-(meth)acryloxypropylmethyldimethoxysilane)], an epoxy group-containing silane coupling agent [e.g., a C$_{2-4}$alkyltriC$_{1-4}$alkoxysilane having an alicyclic epoxy group (such as 2-(3,4-epoxycyclohexyl)ethyltrimethoxysilane), a glycidyloxyC$_{2-4}$alkyltriC$_{1-4}$alkoxysilane (such as 2-glycidyloxyethyltrimethoxysilane, 3-glycidyloxypropyltrimethoxysilane, 3-glycidyloxypropylmethyldiethoxysilane, or 3-glycidyloxypropyltriethoxysilane), and a (glycidyloxyC$_{1-4}$alkoxy)C$_{2-4}$alkyltriC$_{1-4}$alkoxysilane (such as 3-(2-glycidyloxyethoxy)propyltrimethoxysilane)], an amino group-containing silane coupling agent [e.g., an aminoC$_{2-4}$alkylC$_{1-4}$ alkoxysilane (such as 2-aminoethyltrimethoxysilane or 3-aminopropylmethyldimethoxysilane), 3-[N-(2-aminoethyl)amino]propyltrimethoxysilane, N-phenyl-3-aminopropyltrimethoxysilane, and 3-ureidoisopropylpropyltriethoxysilane], a mercapto group-containing silane coupling agent (e.g., a mercaptoC$_{2-4}$alkyltriC$_{1-4}$alkoxysilane, such as 3-mercaptopropyltrimethoxysilane), a carboxyl group-containing silane coupling agent (e.g., a carboxyC$_{2-4}$alkyltriC$_{1-4}$ alkoxysilane, such as 2-carboxyethyltrimethoxysilane), and a silanol group-containing silane coupling agent (e.g., trimethylsilanol). These silane coupling agents may be used alone or in combination.

Among these silane coupling agents, in order to improve the adhesion of the cellulose fiber to the silicone rubber and the transparency, a vinyl group-containing silane coupling agent, particularly, a vinyltriC$_{1-4}$alkoxysilane (such as vinyltrimethoxysilane), is preferred.

The ratio of the hydrophobizing agent (in particular, the silane coupling agent) relative to 100 parts by weight of the fiber is, for example, about 0.001 to 1 part by weight, preferably about 0.005 to 0.8 parts by weight, and more preferably about 0.01 to 0.5 parts by weight. An excessively low ratio of the hydrophobizing agent poorly contributes to the improvement in the mechanical characteristics of the sheet-shaped mold. An excessively high ratio of the hydrophobizing agent causes bleeding out of the hydrophobizing agent from the surface of the sheet-shaped mold.

(Cured Silicone Rubber)

The cured silicone rubber is a cured product obtainable by curing (crosslinking) a curable silicone rubber composition having a polyorganosiloxane structure and may be any cured rubber having a polyorganosiloxane structure. The polyorganosiloxane is a straight-chain, branched-chain, or net-like compound having a Si—O bond (a siloxane bond) and comprises a unit represented by the formula: $R_aSiO_{(4-a)/2}$ (wherein the coefficient a is 0 to 3).

In the formula described above, the substituent R may include, for example, a C$_{1-10}$alkyl group (such as methyl group, ethyl group, propyl group, or butyl group), a halogenated C$_{1-10}$alkyl group (such as 3-chloropropyl group or 3,3,3-trifluoropropyl group), a C$_{2-10}$alkenyl group (such as vinyl group, allyl group, or butenyl group), a C$_{6-20}$aryl group (such as phenyl group, tolyl group, or naphthyl group), a C$_{3-10}$cycloalkyl group (such as cyclopentyl group or cyclohexyl group), and a C$_{6-12}$aryl-C$_{1-4}$alkyl group (such as benzyl group or phenethyl group). These substituents may be used alone or in combination. Among them, a preferred substituent R includes methyl group, phenyl group, an alkenyl group (such as vinyl group), and a fluoroC$_{1-6}$alkyl group.

The polyorganosiloxane may include, for example, a polydialkylsiloxane (a polydiC$_{1-10}$alkylsiloxane, such as a polydimethylsiloxane), a polyalkylalkenylsiloxane (a polyC$_{1-10}$alkylC$_{2-10}$alkenylsiloxane, such as polymethylvinylsiloxane), a polyalkylarylsiloxane (a polyC$_{1-10}$alkyl C$_{6-20}$arylsiloxane, such as a polymethylphenylsiloxane), a polydiarylsiloxane (a polydiC$_{6-20}$arylsiloxane, such as a polydiphenylsiloxane), a copolymer comprising the polyorganosiloxane unit [such as a dimethylsiloxane-methylvinylsiloxane copolymer, a dimethyl siloxane-methylphenylsiloxane copolymer, a dimethylsiloxane-methyl(3,3,3-trifluoropropyl) siloxane copolymer, or a dimethylsiloxane-methylvinylsiloxane-methylphenylsiloxane copolymer]. These polyorganosiloxane may be used alone or in combination.

The polyorganosiloxane may have a substituent at an end or main chain of a molecule thereof insofar as the polyorganosiloxane does not lose a mold-releasability thereof. Examples of the substituent may include an epoxy group, a hydroxyl group, an alkoxy group, a carboxyl group, an amino group or a substituted amino group (such as a dialkylamino group), an ether group, and a (meth)acryloyl group. The polyorganosiloxane may have a trimethylsilyl group, a dimethylvinylsilyl group, a silanol group, or a triC$_{1-2}$alkoxysilyl group as each end group thereof.

In light of excellent softness, it is preferred that the polyorganosiloxane contain a polydiC$_{1-10}$alkylsiloxane, in particular, a polydimethylsiloxane (PDMS), among the above-mentioned polyorganosiloxanes. Further, since it is difficult to make the PDMS thin, an advantage of the present invention is particularly markedly shown.

The structure of the polyorganosiloxane forming the silicone rubber may be a branched or net-like form. In light of softness or others, the polyorganosiloxane preferably has a straight-chain structure. The silicone rubber may include, for example, a methylsilicone rubber, a vinylsilicone rubber, a phenylsilicone rubber, a phenylvinylsilicone rubber, and a fluorosilicone rubber. Among them, a methylsilicone rubber containing a PDMS is preferred. Moreover, the silicone rubber may comprise a straight-chain polyorganosiloxane (such as a methylsilicone rubber) and a branched or net-like polyorganosiloxane (such as an MQ resin) in combination.

The silicone rubber may be a room-temperature-curable silicone rubber or a heat-curable silicone rubber, or may be a one-component curable silicone rubber or a two-component curable silicone rubber. Among them, in light of easy handling or heat resistance, a two-component curable silicone rubber is preferred.

The two-component curable silicone rubber may include a two-component curable silicone rubber applying a hydrosilylation reaction, for example, a combination (a cured product) of a polyorganosiloxane having an alkenyl group (in particular, a polydimethylsiloxane having vinyl group) and an organohydrogenpolysiloxane (in particular, a polydimethylsiloxane having a plurality of hydrogen atoms bonded to a silicon atom (hydride group or silicon hydride)). For the two-component curable silicone rubber, the organohydrogenpolysiloxane is used as a curing agent, and the ratio of the curing agent relative to 100 parts by weight of the polyorganosiloxane having an alkenyl group is about 1 to 30 parts by weight, preferably about 3 to 20 parts by weight, and more preferably about 5 to 15 parts by weight in terms of solid content.

The curable silicone rubber composition may contain a curing catalyst. As the curing catalyst, a usual catalyst may be employed depending on the kind of the silicone rubber. The usual catalyst may include, for example, an organic peroxide [e.g., a diacyl peroxide, a peroxyester, and a dialkyl peroxide (such as dicumyl peroxide, t-butylcumyl peroxide, 1,1-di-butylperoxy-3,3,5-trimethylcyclohexane, 2,5-dimethyl-2,5-di(t-butylperoxy)-hexane, 1,3-bis(t-butylperoxyisopropyl)benzene, or di-t-butylperoxide)], a tin salt (such as tin soap), and a platinum group metal compound (e.g., a platinum-series catalyst, such as platinum fine particle, platinum black, chloroplatinic acid, a solution of chloroplatinic acid in an alcohol, a complex of platinum and an olefin, a complex of platinum and an alkenylsiloxane, or a platinum-phosphorus complex; and a palladium-series catalyst or rhodium-series catalyst corresponding to the platinum-series catalyst mentioned above). The ratio of the curing catalyst relative to the cured silicone rubber is, for example, about 0.1 to 5000 ppm, preferably about 1 to 1000 ppm, and more preferably about 3 to 500 ppm on the basis of weight.

The cured silicone rubber has a modulus of elasticity in tension of, for example, about 0.1 to 2000 MPa, preferably about 0.5 to 1000 MPa, and more preferably about 1 to 100 MPa (particularly about 1 to 10 MPa), and for example, may have a modulus of elasticity in tension of about 1 to 5 MPa (particularly about 1.5 to 3 MPa). A cured silicone rubber having too low a modulus of elasticity in tension (being too soft) does not have an improved handleability even in a case where the cured silicone rubber is compounded with a fiber (such as a cellulose fiber). Specifically, the resulting compound is such a silicone gel as being used for a potting agent, and is impossible to form into a sheet. In contrast, a cured silicone rubber having too high a modulus of elasticity in tension (being too hard) has a low adaptability (or followability) to a curved surface, and thin product thereof is easily cracked. As used herein, the modulus of elasticity in tension can be measured in accordance with JIS K7161. For details, the modulus of elasticity in tension can be measured according to the method stated in Examples described below.

(Characteristics of Sheet-Shaped Mold)

The sheet-shaped mold of the present invention comprises a cured silicone rubber and a fiber. The ratio of the cured silicone rubber relative to 100 parts by weight of the fiber is, for example, about 100 to 10000 parts by weight, preferably about 200 to 9000 parts by weight, and more preferably about 300 to 8000 parts by weight (particularly about 500 to 5000 parts by weight). In a case where the ratio of the cured silicone rubber is too low, the resulting sheet-shaped mold has a low mold-releasability or a low transparency. In a case where the ratio of the cured silicone rubber is too high, the resulting sheet-shaped mold has a low mechanical strength and is difficult to form into a thin product.

The fiber may be formed into a nonwoven fabric which is contained in the sheet-shaped mold. Specifically, the sheet-shaped mold may contain a sheet-shaped nonwoven fabric (or a nonwoven fabric sheet) in which the fiber is impregnated with the cured silicone rubber (or in which the silicone rubber permeates the fabric and is cured). In that case, since the cured silicone rubber is filled in voids (or gaps) between fibers entangled in the nonwoven fabric, the sheet-shaped mold of the present invention can ensure efficient increase in mechanical strength and easier formation of a thin product. As the nonwoven fabric, one or a plurality of nonwoven fabrics may be used.

The sheet-shaped mold of the present invention may have an objective shape (pattern) formed on one surface (or one side) thereof. The shape (pattern) may be a smooth (or flat) pattern or may usually be an uneven pattern. The uneven pattern is composed of a plurality of bumps (or protrusions) and/or dents (or recesses or depressions). The uneven pattern may be a random pattern. The uneven pattern is usually a regular or periodic pattern. The pattern may include, but should not be limited to, for example, a stripe pattern, a grid pattern, and a moth-eye pattern. The uneven pattern is usually applied to, for example, soft lithography, capillary force lithography, or imprint lithography. Among them, the sheet-shaped mold is preferably used for imprint lithography in that the sheet-shaped mold allows excellent mold releasability, in particular, for nanoimprint lithography in that even the sheet-shaped mold having a small thickness has a sufficient strength.

It is preferred that the uneven pattern have a form corresponding to a pattern to be transferred to an object. For example, in a case where the sheet-shaped mold of the present invention is used as a mold for imprint lithography, the sheet-shaped mold has an inverse uneven pattern of an uneven pattern to be transferred to an object.

In the uneven pattern, the bump or the dent may have a minimum width of about 50 nm to 100 μm. In particular, the uneven pattern may be a nanoscale pattern. The width of at least one bump or dent (the minimum width of the bump or dent) may be, for example, not more than 5000 nm (e.g., about 100 to 4000 nm), preferably not more than 3000 nm (e.g., about 100 to 2000 nm), and more preferably not more than 2000 nm (particularly about 100 to 1000 nm).

The bump has an average height of, for example, about 50 nm to 100 μm, preferably about 100 to 4000 nm, and more preferably about 100 to 2000 nm (particularly about 100 to 1000 nm). The uneven pattern has a ratio of the width relative to the height (an aspect ratio) of, for example, about 0.2 to 5 and preferably about 0.5 to 2.

The sheet-shaped mold of the present invention may be composed of a single layer or a plurality of layers with different compositions. In a case where the sheet-shaped mold comprises a plurality of layers (for example, two layers), a first layer may contain a fiber and a second layer may be free from a fiber. In particular, the second layer free from a fiber may have a pattern (particularly an uneven pattern) formed thereon. In the layer containing the fiber, in light of strength, it is preferred that the fiber and the cured silicone rubber be substantially uniformly mixed. Among them, in order to improve the strength of the whole sheet, it is preferred that the sheet-shaped mold contain at least a fiber in a layer having no pattern formed thereon. In order to prevent the pattern from deforming due to heating, it is particularly preferred that the sheet-shaped mold contain a fiber in a layer having a pattern (pattern portion) formed thereon as well as the layer having no pattern formed thereon (a sheet-shaped mold composed of a single layer, or a sheet-shaped mold composed of a plurality of layers, each layer containing a fiber).

In a case where the sheet-shaped mold comprises a plurality of layers, the total thickness of the layer (s) containing the fiber is preferably not less than 30% and more preferably not less than 50% (particularly not less than 70%) in the thickness of the sheet-shaped mold (for sheet-shaped mold having a bump on a surface thereof, the thickness based on the top of the bump).

Since the sheet-shaped mold of the present invention comprises the cured silicone rubber reinforced with the fiber, the mold has a high mechanical strength. The sheet-shaped mold may have a modulus of elasticity in tension measured in accordance with JIS K7161 of not less than 3 MPa, for example, about 3 to 30 MPa, preferably about 4 to 25 MPa, and more preferably about 5 to 20 MPa (particularly about 8 to 15 MPa). A sheet-shaped mold having too low a modulus of elasticity in tension has an insufficient strength in a case where the mold has a small thickness or a large area.

The sheet-shaped mold of the present invention may have a stress at break measured in accordance with JIS K6251 of not less than 0.5 MPa. In order to improve the strength of the sheet-shaped mold in a case where the mold is thin, the stress at break may be, for example, not less than 3.0 MPa (e.g., about 3.0 to 50 MPa), preferably not less than 4.0 MPa (e.g., about 4.0 to 30 MPa), and more preferably not less than 8.0 MPa (e.g., about 8.0 to 20 MPa).

Since the sheet-shaped mold of the present invention has a sufficient strength, the sheet-shaped mold can be rolled up. Since even a sheet-shaped mold having a large area (for example, about 9 $m^2$, particularly about 4 $m^2$) is hardly loosened, the sheet-shaped mold is hardly damaged when an object is released from the mold.

The sheet-shaped mold of the present invention can show a sufficient strength even in a case where the mold is thin. The sheet-shaped mold has an average thickness (for the sheet-shaped mold having a bump, the thickness based on the top of the bump) of, for example, about 5 to 1000 µm (e.g., about 5 to 500 µm), preferably about 10 to 300 µm, and more preferably about 30 to 200 µm (particularly about 50 to 150 µm). Too thin a sheet-shaped mold is hard to produce. Too thick a sheet-shaped mold cannot effectively show an advantage of the present invention.

Since the sheet-shaped mold of the present invention has a low coefficient of linear expansion, the mold has an excellent heat resistance and the uneven pattern of the mold is hardly deformable to temperature change.

The sheet-shaped mold has a coefficient of linear expansion of, for example, about 5 to 1000 ppm (e.g., about 5 to 200 ppm), preferably about 5 to 150 ppm, and more preferably about 5 to 100 ppm. In a case where the sheet-shaped mold has an excessively high coefficient of linear expansion, the uneven pattern of the sheet-shaped mold is deformed due to heat, which makes the uneven pattern to be transferred unstable.

The sheet-shaped mold of the present invention may have a total light transmittance (a transmittance measured in accordance with JIS K7105) at a thickness of 100 µm of not less than 50%, for example, about 50 to 99%, preferably about 60 to 95%, and more preferably about 70 to 90%. Thus since the sheet-shaped mold of the present invention also has a high transparency, an object filled in the mold can also be irradiated with light. This allows easy curing of an object composed of a photo-curable resin.

The sheet-shaped mold of the present invention may contain a usual additive according to the purposes. Examples of the additive may include, another fiber, a sizing agent, a wax, an inorganic filler, a coloring agent, a stabilizer (such as an antioxidant, a heat stabilizer, or an ultraviolet absorber), a plasticizer, an antistatic agent, and a flame retardant.

[Process for Producing Sheet-Shaped Mold]

The sheet-shaped mold of the present invention can be produced by a usual production process. For example, the production process comprises a sheet-forming step of forming a compound comprising a fiber and a curable silicone rubber composition into a sheet (or an uncured sheet) and a curing step of curing the curable silicone rubber composition to give a composite sheet comprising the fiber and a cured product of the curable silicone rubber composition.

(Sheet-Forming Step)

In the sheet-forming step, the fiber and the curable silicone rubber composition (a first curable silicone rubber composition) are compounded and formed into a sheet. The curable silicone rubber composition is a liquid composition containing the above-mentioned uncured curable rubber having the polyorganosiloxane structure. The curable rubber is cured to form the above-mentioned cured silicone rubber.

The curable silicone rubber composition comprises the liquid silicone rubber and the curing catalyst, and may further comprise a solvent in order to improve the permeability to the fibers or the dispersibility of the fibers. The solvent preferably includes a hydrophilic solvent in light of high productivity and less damage to the environment.

The hydrophilic solvent may include, for example, water, an alcohol (e.g., a $C_{1-4}$alkanol, such as methanol, ethanol, isopropanol, or 1-butanol), an alkanediol (e.g., a $C_{2-4}$alkanediol, such as ethylene glycol, propylene glycol, or butylene glycol), a cellosolve (e.g., a $C_{1-4}$alkyl cellosolve, such as methyl cellosolve or ethyl cellosolve), a cellosolve acetate (e.g., a $C_{1-4}$alkyl cellosolve acetate, such as ethyl cellosolve acetate), a carbitol (e.g., $C_{1-4}$alkyl carbitol, such as methyl carbitol or ethyl carbitol), a ketone (e.g., a $diC_{1-4}$alkyl ketone, such as acetone or methyl ethyl ketone), and an ether (e.g., a circular or chain $C_{4-6}$ether, such as dioxane or tetrahydrofuran). Among them, in order to improve the dispersibility of the fiber (in particular, the cellulose fiber) and improve the affinity for the curable silicone rubber, a preferred organic solvent includes, for example, a $C_{1-4}$alkanol (such as ethanol or isopropanol) and a $diC_{1-4}$alkyl ketone (such as acetone or methyl ethyl ketone). These solvents may be used alone or in combination.

In the curable silicone rubber composition, the ratio of the solvent relative to 100 parts by weight of the curable silicone rubber is, for example, about 10 to 100 parts by weight, preferably about 15 to 80 parts by weight, and more preferably about 20 to 60 parts by weight.

As the method of compounding for producing the composite sheet, there may be used a method (a cast method) that comprises dispersing the fiber in the solvent to prepare a dispersion (slurry), mixing the dispersion and the curable silicone rubber composition, and then casting (or coating) the resulting mixture, or a method (an impregnation method) that comprises a step of impregnating a nonwoven fabric obtained from the fiber by paper production with the curable silicone rubber composition.

(A) Cast Method

For the cast method, as the solvent contained in the dispersion, the same hydrophilic solvent as the solvent to be added to the curable silicone rubber composition is widely used. Among others, a preferred one includes water or an organic solvent, for example, a $C_{1-4}$alkanol (such as ethanol or isopropanol) and a di$C_{1-4}$alkyl ketone (such as acetone or methyl ethyl ketone). These solvents may be used alone or in combination.

The dispersion has a solid content of, for example, about 0.1 to 50% by weight, preferably about 1 to 30% by weight, and more preferably about 3 to 20% by weight (particularly about 5 to 15% by weight).

The fiber (in particular, the cellulose fiber) contained in the dispersion may be hydrophobized by addition of a hydrophobizing agent.

The cast method to be used may include a usual method. For example, the mixture may be formed into a sheet by flow-casting or filling in an objective molding box, or may be formed into a sheet by coating using a usual coater.

(B) Impregnation Method

For the impregnation method, the nonwoven fabric can be produced by a usual method, for example, a paper production, such as a wet paper production or a dry paper production. The wet paper production can be carried out by a usual means, for example, a paper machine for handmade paper or a wet-paper machine provided with a porous plate. The dry paper production can also be carried out by a usual manner, for example, an airlaid process or a card process. Among them, it is preferred that the production method comprise a paper-producing step using a wet paper production.

The dispersion (slurry) containing the fiber (in particular, the cellulose fiber) to be subjected to the wet paper production is prepared by dispersing the fiber in a solvent. As the solvent, the same hydrophilic solvent as the solvent to be added to the curable silicone rubber composition is widely used. Among them, a preferred one includes water or an organic solvent, for example, a $C_{1-4}$alkanol (such as ethanol or isopropanol) and a di$C_{1-4}$alkyl ketone (such as acetone or methyl ethyl ketone). These solvents may be used alone or in combination.

In the wet paper production, the dispersion has a solid content of, for example, about 0.01 to 10% by weight, preferably about 0.03 to 5% by weight, and more preferably about 0.05 to 3% by weight (particularly about 0.1 to 1% by weight).

It is preferred that the nonwoven fabric be, thin. The nonwoven fabric has an average thickness of, for example, about 5 to 50 μm, preferably about 10 to 45 μm, and more preferably about 20 to 40 μm.

The nonwoven fabric may have an average pore size selected from the range of about 0.01 to 5 μm. For the nonwoven fabric comprising the fine cellulose fiber, the nonwoven fabric has an average pore size of, for example, about 10 to 100 nm, preferably about 20 to 90 nm, and more preferably about 30 to 80 nm. A nonwoven fabric having too large a pore size is difficult to support the silicone rubber.

The nonwoven fabric may have a basis weight of, for example, about 0.1 to 50 g/m$^2$, preferably about 1 to 30 g/m$^2$, and more preferably about 3 to 20 g/m$^2$ (particularly about 5 to 15 g/m$^2$). The nonwoven fabric may have a void ratio of, for example, about 10 to 90%, preferably about 15 to 85%, and more preferably about 30 to 80%. A nonwoven fabric having too high a void ratio is difficult to support the silicone rubber. In contrast, a nonwoven fabric having too low a void ratio is difficult to be impregnated with the silicone rubber.

The nonwoven fabric may be subjected to a hydrophobization treatment (in particular, a treatment with the above-mentioned silane coupling agent) before the impregnation step. The method for the hydrophobization treatment may include a method that comprises coating the surface of the fiber constituting the nonwoven fabric with a solution containing a hydrophobizing agent, and then removing the solvent. As the coating method, there may be employed a usual method, for example, a coater method, a dipping method, a spraying method, and an impregnation method. Among them, for example, a spraying method or an impregnation method is widely used.

The solvent can be selected according to the species of the hydrophobizing agent. For example, the solvent exemplified as the solvent for dispersing the fiber may be used. The solvent may be removed by air drying. The solvent is usually removed by heat drying at a temperature of about 50 to 200° C. (particularly about 100 to 150° C.). The proportion of the hydrophobizing agent in the solution is, for example, about 0.1 to 10% by weight, preferably about 0.3 to 5% by weight, and more preferably about 0.5 to 3% by weight.

The method for impregnating the nonwoven fabric with the curable silicone rubber composition may include a usual method, for example, immersing of the nonwoven fabric in the curable silicone rubber composition, coating of the nonwoven fabric with the curable silicone rubber composition, and spraying of the nonwoven fabric with the curable silicone rubber composition. Among them, in light of easy and uniform impregnation of the nonwoven fabric with the curable silicone rubber composition, the immersion of the nonwoven fabric in the curable silicone rubber composition is preferred.

For the impregnation method, in order to inhibit the decrease in the surface smoothness of the composite sheet due to air bubbles leaked out of the cellulose nonwoven fabric to the surface thereof, the nonwoven fabric (in particular, the cellulose nonwoven fabric) may be impregnated with the curable silicone rubber composition by applying pressure. The application of pressure in the impregnation step causes air-bubble leakage out of the nonwoven fabric and, at the same time, makes the surface of the nonwoven fabric smooth. Thus, in the subsequent curing step, the leakage of air bubbles and the curing of the curable silicone rubber composition with traces of air bubbles left (generation of bubble defect) can be prevented.

As a method of applying pressure, the nonwoven fabric may be impregnated with the curable (liquid) silicone rubber composition under pressure by a pressurizer, or the nonwoven fabric containing the curable silicone rubber composition may physically be pressurized by a roller or a press.

The pressure can suitably be selected according to the method, temperature, or others. The pressure may be, for example, about 0.01 to 50 MPa, preferably about 0.05 to 30

MPa, and more preferably about 0.1 to 10 MPa (particularly about 1 to 5 MPa). In a case where the impregnation is carried out at an ordinary (or room) temperature under pressure, the pressure may be, for example, about 0.5 to 10 MPa (particularly about 1 to 5 MPa). In a case where the pressure treatment by a press or other means is continued in the subsequent curing step, the pressure may be, for example, about 0.03 to 1 MPa (particularly about 0.05 to 0.5 MPa).

The temperature of the pressure treatment is not particularly limited to a specific one and, for example about 0 to 100° C., preferably about 5 to 80° C., more preferably about 10 to 50° C., and usually an ordinary temperature (about 20 to 30° C.).

As the method for compounding and sheet-formation, the impregnation method is particularly preferred in that even a sheet-shaped mold having a high fiber concentration is easy to form into a thin product due to easy control of the solid content and has an excellent productivity.

For the sheet-forming step (the cast method and the impregnation method), in a case where a water dispersion containing a cellulose fiber [such as a microfibrillated fine cellulose fiber (cellulose nanofiber)] is used as the dispersion containing the fiber, the water in the dispersion may be replaced with the above-mentioned hydrophilic organic solvent, or the organic solvent may be added to the water dispersion. The hydrophilic organic solvent may be the same solvent as that contained in the curable silicone rubber composition, for example, a ketone (such as acetone). In light of replacement efficiency, the solvent may be a $C_{1-4}$alkanol, such as ethanol or isopropanol (in particular, isopropanol). The cellulose fiber may be subjected to a hydrophobization treatment by adding a hydrophobizing agent to the dispersion containing the cellulose fiber.

In order to replace a dispersion medium (water) contained in the water dispersion with a hydrophilic organic solvent, it is preferred that the organic solvent in equal or more amount to the water be added to the dispersion. The ratio of the organic solvent relative to 100 parts by weight of the water contained in the water dispersion is, for example, about 100 to 5000 parts by weight, preferably about 200 to 4000 parts by weight, and more preferably about 300 to 3000 parts by weight (particularly about 500 to 2500 parts by weight).

In order to increase the degree of replacement with the organic solvent, the replacement with the organic solvent may be repeated a plurality of times. In light of the balance of replacement efficiency and easiness, the number of repetitions is usually about 1 to 5, preferably 2 to 4, and more preferably 2 to 3.

According to the process for producing the sheet-shaped mold of the present invention, prior to the curing step, the composition containing the fiber and the curable silicone rubber or the nonwoven fabric impregnated with the curable silicone rubber composition may be allowed to stand at a room temperature (for example, about 20 to 30° C.) in order to remove the solvent from the mixture obtained in the sheet-forming step and promote the addition polymerization of the curable silicone rubber. The standing time is, for example, about 1 to 48 hours and preferably about 5 to 30 hours.

(Curing Step)

In the curing step, the curable silicone rubber composition can be cured to give a composite sheet containing a cured product of the curable silicone rubber composition and the fiber. The curable silicone rubber composition may be cured at a room temperature. In order to increase the reactivity and improve the strength of the resulting cured product, the curing may preferably be carried out by heating. The heating temperature for curing can be selected according to the species of the rubber, and is, for example, about 100 to 200° C., preferably about 120 to 180° C., and more preferably about 130 to 160° C. The heating time is, for example, about 1 minute to 48 hours and preferably about 30 minutes to 10 hours.

Prior to curing the curable silicone rubber, the composition containing the fiber and the curable silicone rubber or the nonwoven fabric impregnated with the curable silicone rubber composition may be allowed to stand at a room temperature (for example, about 20 to 30° C.) in order to remove the solvent and promote the addition polymerization of the silicone rubber. The standing time is, for example, about 1 to 48 hours and preferably about 5 to 30 hours.

The process for producing the sheet-shaped mold of the present invention may comprise a pattern-forming step of forming an objective pattern on one surface (or one side) of the uncured composite sheet in the curing step. As the method for forming the objective pattern, a usual method may be utilized. For example, in a case where a sheet-shaped mold as a mold for imprint lithography is produced, an uneven pattern that is inverted with respect to an uneven pattern to be formed on an object of imprint lithography is formed on the composite sheet.

The inverted uneven pattern may be formed by a method using a master mold. For the method, it is sufficient that the pattern of the master mold can be transferred to the sheet-shaped mold. For the sheet-shaped mold having a single-layer (or monolayer) structure, in the above-mentioned curing step, the pattern of the master mold may be transferred by putting the master mold on one side of the curable silicone rubber composition formed into a sheet.

For the sheet-shaped mold having a double-layer (bilayer) structure, the method may comprise a step of pouring a second curable silicone rubber composition into the master mold (pouring step), a step of laminating the composite sheet on the poured second curable silicone rubber composition (laminating step), a step of curing the second curable silicone rubber composition to give a sheet-shaped mold having a cured product of the second curable silicone rubber composition and the composite sheet in layers (curing step), and a step of releasing the resulting sheet-shaped mold from the master mold (releasing step). In the lamination step, when the composite sheet is put into contact with the second curable silicone rubber composition poured into the master mold, the composite sheet may be pressed in order to avoid contamination with air bubbles. In the curing step, the second curable silicone rubber composition can be cured in the same conditions as those for the above-mentioned curable silicone rubber composition.

Since the sheet-shaped mold of the present invention has a high mechanical strength and an excellent flexibility, the sheet-shaped mold can be rolled up. Thus a roll of the sheet-shaped mold can be used for continuous production of an object. In particular, a large-area sheet-shaped mold for forming a roll can be produced by using the master mold in the pattern-forming step. The master mold may be a large-area master mold obtainable by providing a mold smaller than the master mold, repeatedly transferring a pattern of the smaller mold to a resin for the master mold so as to arrange the transferred patterns closely in lengthwise and crosswise directions, and then curing the resin for the master mold. In a case where the sheet-shaped mold is used for imprint lithography, the resin for the master mold may be a resin for imprint (in particular, a photocationic-curable resin described later). The master mold obtained from the resin for the master mold may be subjected to an electroforming treatment to give a metallic (e.g., nickel) master mold, or the master mold may be surface-coated with a metal in order to improve the durability.

[Method for Transferring Pattern Formed on Sheet-Shaped Mold]

According to the present invention, an objective pattern (or shape) can be transferred to an object (an object to be transferred) by using the sheet-shaped mold. The transferring method may include, but should not be limited to, for example, a suitable patterning technique, such as soft lithography, capillary force lithography, or imprint lithography.

The material for the object may include, but should not be limited to, a resin component, such as a thermoplastic resin or a curable resin. In particular, since the sheet-shaped mold of the present invention has a high transparency (light transmittance property), light can be applied to the object through the sheet-shaped mold. Thus, as the object, a preferred one to be used may include a photo-curable resin, for example, a photo-radical curable resin (e.g., a photo-curable polyester-series resin, a photo-curable acrylic resin, a photo-curable epoxy (meth)acrylate resin, and a photo-curable urethane (meth)acrylate resin) or a photocationic-curable resin (e.g., an epoxy resin, an oxetane resin, and a vinyl ether resin). In light of an excellent mold-releasability and less damage of the sheet-shaped mold due to adhesion to the resin that forms the object, a photocationic-curable resin or an epoxy resin is particularly preferred. The epoxy resin may include, for example, a glycidyl ether-based epoxy resin, a glycidyl ester-based epoxy resin, an alicyclic epoxy resin, a glycidyl amine-based epoxy resin, and a long-chain aliphatic epoxy resin. The epoxy resin may contain at least an alicyclic epoxy compound in light of a low viscosity and an excellent mold-releasability. Since the sheet-shaped mold that comprises the cured silicone rubber and the fiber has a large void therein (e.g., a void between the fibers, and a void of an interface between the rubber and the fiber), the photo-radical curable resin, which has a relatively small molecular weight, enters the void in the mold and makes transferring difficult. In contrast, the photocationic-curable resin hardly enters the void in the mold. The photo-curable resin may contain a usual additive. Examples of the additive may include a curing agent and a polymerization initiator (e.g., a photocationic polymerization initiator).

As an example of the transferring method using the sheet-shaped mold of the present invention, an imprint lithography method using the photo-curable resin as the object is shown. This method may comprise a lamination step of laminating (or putting) an object precursor (an uncured or semi-cured photo-curable resin) on a pattern side of a sheet-shaped mold, a curing step of curing the precursor to form a laminate of the object and the sheet-shaped mold, and a mold-releasing step of releasing the sheet-shaped mold from the object. In the lamination step, the object precursor may be laminated to a substrate (such as a water glass) beforehand in order to easily handle the object precursor, or the laminate may be dried to prepare a semi-cured laminate. In the curing step, the precursor may be cured by light irradiation (e.g., ultraviolet irradiation) from the sheet-shaped mold side, since the sheet-shaped mold has a high light transmittance property.

EXAMPLES

The following examples are intended to describe this invention in further detail and should by no means be interpreted as defining the scope of the invention. The fiber diameter and the fiber length of cellulose fibers and fibers used in Examples and Comparative Examples, and the average thickness, the modulus of elasticity in tension, the handleability, the ultraviolet (UV) curability, and the stress at break of nonwoven fabrics, composite sheets, and sheet-shaped molds were measured according to the methods described below. The sheet-shaped molds of Examples 1 to 6 and Comparative Examples 1 to 3 were evaluated for transfer characteristic according to the method described below.

[Fiber Diameter]

A photograph of fibers was taken by a scanning electron microscope (SEM) of 50000 magnifications. Any two lines were drawn on the photograph. Diameters of all fibers intersecting either or both of the two lines were measured, and the average fiber diameter (n=20 or more) was calculated. Where the two lines were drawn was not particularly limited to a specific one as far as the number of fibers intersecting either or both of the two lines was not less than 20.

[Fiber Length]

The fiber length was measured by a fiber length measuring apparatus ("FS-200" manufactured by Kajaani).

[Average Thickness of Nonwoven Fabric, Composite Sheet, and Sheet-Shaped Mold]

In accordance with JIS L1085, the thickness of a nonwoven fabric, a composite sheet, or a sheet-shaped mold was measured at any 10 points by a thickness measuring apparatus ("FFA-12" manufactured by OZAKI MFG. CO., LTD., probe 16 mmϕ), and the average value thereof was determined.

[Weights of Nonwoven Fabric, Composite Sheet, Sheet-Shaped Mold, and Each Component]

In accordance with JIS B7611, the weights of a nonwoven fabric, a composite sheets, a sheet-shaped mold, and each component were weighed by a balance ("XP205" manufactured by Mettler-Toledo International Inc.).

[Modulus of Elasticity in Tension]

In accordance with JIS K7161, a sheet-shaped mold was cut to a width of 10 mm and a length of 100 mm to give a specimen. The specimen was pulled at a rate of 20 mm/minutes by a tensile testing machine ("RTM-1350" manufactured by A & D Company, Limited), and the modulus of elasticity in tension was measured.

[Handleability]

A film 70 mm square was produced. The film was pressed against a glass plate by a roller and then released from the glass plate by hand. This operation (pressing and releasing) was repeatedly practiced, and the number of times the releasing succeeded was counted.

[Ultraviolet (UV) Curability]

A cationic UV-curable resin ("NICT825" manufactured by Daicel Corporation) was provided. The UV-curable resin was masked (or the whole surface (2500 mm$^2$) of the UV-curable resin was covered) with a composite sheet and irradiated with ultraviolet rays. The curability in irradiation conditions (λ=365 nm, 35 mW/cm$^2$, after 30 seconds) was assessed. As standards of the curability, the separation of the composite sheet from the UV-curable resin was evaluated based on the following indexes.

A: The UV-curable resin is so cured that the composite sheet can be separated without problems.

B: The UV-curable resin is in a semi-cured state when the composite sheet is separated.

C: The UV-curable resin is liquid when the composite sheet is separated.

[Stress at Break]

In accordance with JIS K6251, a test sample of a composite sheet was prepared using a No. 7 dumbbell. The resulting sample was subjected to a tensile test by a tensile testing machine ("TENSILON RTF-1350" manufactured by A & D Company, Limited), and the stress at break was measured.

[Evaluation of Transfer Characteristic]

The sheet-shaped molds obtained in Examples and Comparative Examples were evaluated for transfer characteristic according to the following method.

(Preparation of Resin for Imprint)

At a room temperature (25° C.), 20 parts by weight of an epoxy compound ("EHPE3150" manufactured by Daicel Corporation) as a photocationic polymerizable compound, 20 parts by weight of an epoxy compound ("JER YX8000" manufactured by Mitsubishi Chemical Corporation), 30 parts by weight of 3,4,3',4'-diepoxybicyclohexyl, 15 parts by weight of an alicyclic epoxy compound ("CELLOXIDE 2021P" manufactured by Daicel Corporation), 15 parts by weight of an oxetane compound ("OXT221" manufactured by Toagosei Co., Ltd.), 6 parts by weight of a photocationic polymerization initiator ("CPI-300K" manufactured by San-Apro Ltd.), 1 part by weight of an antioxidant ("CHI-NOX1010" manufactured by Double Bond Chemical Ind. Co., Ltd.), and 1 part by weight of a stabilizer ("HP-10" manufactured by ADEKA CORPORATION) were stirred for dissolving each component uniformly to give a liquid photo-curable composition (a resin for imprint) at a room temperature.

(Pattern Transfer)

The resulting resin for imprint was diluted with propylene glycol methyl ether acetate ("MMPGAC" manufactured by Daicel Corporation) so that the resulting mixture had a solid content of 60% by weight. The mixture was applied on a water glass 40 mm square by spin coating at 3000 rpm for 30 seconds and then dried at 90° C. for 5 minutes on a hot plate to form a resin layer for imprint having a thickness of 2 mm.

Then a sheet-shaped mold was laminated on the resin layer so that an uneven pattern of the mold faced the resin layer. The laminate was pressurized at 0.1 MPa for 60 seconds by an imprinting apparatus ("NM-0403" manufactured by Meisyo Kiko Co., Ltd.) and then irradiated with UV rays (irradiation conditions λ=365 nm, 100 mW/cm², 60 seconds) to cure the resin layer.

The resin layer was removed from the imprinting apparatus and released from the sheet-shaped mold. Thereafter, the transfer of the uneven pattern to the resin layer was evaluated on the basis of the following indexes.

(Evaluation of Transfer Characteristic)

The transfer rate of each fine structure obtained in Examples and Comparative Examples was calculated, and each fine structure was evaluated for transfer characteristic (precise reproduction of the mold pattern on the fine structure) on the basis of the following criteria.

A: The transfer rate is not less than 70% (the transfer characteristic is extremely good).

B: The transfer rate is not less than 30% and less than 70% (the transfer characteristic is good).

C: The transfer rate is less than 30% (the transfer characteristic is poor).

The transfer rate was calculated from a pattern height (H1) of a mold and a pattern height (H2) transferred to a fine structure according to the following formula. The pattern heights were obtained by AFM.

Transfer rate=$(H2/H1) \times 100$ (Evaluation of Continuous Transfer Characteristic)

In each of Examples and Comparative Examples, production of a fine structure was performed continuously 50 times. The fine structure obtained in the first production and that obtained in the 50th production were observed by AFM. The transfer rate of each fine structure was calculated from the height of the fine pattern of each fine structure, and, according to the variation, the continuous transfer characteristic was evaluated. The transfer rate was calculated from the above-mentioned formula.

A: The variation of the transfer rate is within the range of ±20% of the initial value (the continuous transfer characteristic is good).

B: The variation of the transfer rate is out of the range of ±20% of the initial value (the continuous transfer characteristic is poor).

The variation of the transfer rate and the initial value are as follows.

Variation of transfer rate=(Transfer rate of fine structure obtained in the first production)−(Transfer rate of fine structure obtained in the 50th production)

Initial value=Transfer rate of fine structure obtained in the first production

Example 1

Preparation of Cellulose Fiber

A slurry (water dispersion) (100 liters) containing a NBKP pulp (manufactured by Marusumi Paper Co., Ltd., solid content about: 50% by weight, Kappa number: about 0.3) in a proportion of 1% by weight was prepared. Then the slurry was beat-treated 10 times by a disc refiner ("SUPER-FIBRATER 400-TFS" manufactured by HASEGAWA REFRIGERATION, LTD.) at a clearance of 0.15 mm and a disc rotation frequency of 1750 rpm to give a refined product. The refined product was treated 20 times at a treatment pressure of 50 MPa by a first homogenizer ("15M8AT" manufactured by Gorlin) equipped with a usual non-crushing-type homovalve sheet (the inner diameter of downstream end of hollow cylindrical projection/the thickness of ring end face=1.9/1). The resulting product was further treated 20 times at a treatment pressure of 120 MPa by a second homogenizer ("PANDA2K" manufactured by Niro Soavi) equipped with a crushing-type homovalve sheet (the inner diameter of downstream end of hollow cylindrical projection/the thickness of ring end face=16.8/1). The resulting fine fiber had an average fiber diameter of 29.0 nm, a standard deviation of fiber diameter distribution of 14.1 nm, a maximum fiber diameter of 64.3 nm, an average fiber length of 158 and an aspect ratio (the average fiber length/the average fiber diameter) of 5440.

(Preparation of Cellulose Nonwoven Fabric)

The resulting water dispersion containing the fine cellulose fiber (solid content: 1% by weight) was dehydrated and concentrated until the solid content of the dispersion was reduced to 10% by weight. To 1 kg of the resulting dispersion were added 10 liters of isopropanol (10 times as much as water), and stirred and dispersed for 5 minutes by a hand stirrer ("UT1305" manufactured by Makita Corporation). The resulting dispersion was wrung by hand with a filter fabric until the solid content of the dispersion was reduced to 30% by weight. This solvent replacement treatment was repeated again. From the resulting dispersion having a solid content of 30% by weight, a cellulose nonwoven fabric having 110 mmϕ and a basis weight of 10 g/m² was produced by a sheet machine ("SHEET MACHINE" manufactured by Toyo Seiki Seisaku-sho, Ltd.). The cellulose nonwoven fabric has an average thickness of 22
(Preparation of Liquid Silicone Rubber Composition)

A liquid silicone rubber (PDMS) ("X-32-3212" manufactured by Shin-Etsu Chemical Co., Ltd.), a curing agent ("CX-32-3212" manufactured by Shin-Etsu Chemical Co., Ltd.), and acetone were mixed in a ratio (weight ratio) of the liquid silicone rubber/the curing agent/the acetone of 10/1/3 to prepare a liquid silicone rubber composition.
(Preparation of Composite Sheet)

The resulting cellulose nonwoven fabric was strained and fixed on an aluminum frame having an opening 50 mm square. The aluminum flame having the fabric fixed thereon was put in a vat with the liquid silicone rubber composition and allowed to stand for 30 minutes to impregnate the cellulose nonwoven fabric with the liquid silicone rubber composition. The aluminum flame was pulled up, and the excess liquid silicone rubber composition was squeegeed. The aluminum flame was allowed to stand at 23° C. for 24 hours by vertically handing down the flame, and then allowed to stand at 150° C. over 2 hours for curing. The resulting composite sheet had an average thickness of 73
(Preparation of Sheet-Shaped Mold)

A mold having an uneven pattern (made of nickel (Ni), each width of dent and bump: 500 nm, height of bump: 500 nm) was fixed on an aluminum flame 50 mm square, and the liquid silicone rubber composition was poured into the mold. Then the resulting composite sheet was placed on the surface of the poured liquid silicone rubber composition and pressed against the surface of the liquid so as to avoid contamination with air bubbles. The liquid silicone rubber composition and the composite sheet were allowed to stand as they were at 23° C. for 24 hours and then allowed to stand at 150° C. over 2 hours for curing to give a sheet-shaped mold composed of a cured product of the poured liquid silicone rubber composition and the composite sheet joined to the cured product. The sheet-shaped mold was released from the nickel mold to give a sheet-shaped mold having an uneven pattern (each width of dent and bump: 500 nm, height of bump: 500 nm) on a surface thereof. The sheet-shaped mold weighed 0.024 g and had an average thickness of 100 μm.

Example 2

A cellulose nonwoven fabric having a basis weight of 10 g/m² was produced by the same paper production as Example 1 except that a cellulose fiber ("CELISH KY-100G" manufactured by Daicel Corporation, average fiber diameter: 300 nm) was used as a fine cellulose fiber. The cellulose nonwoven fabric had an average thickness of 34 μm. A composite sheet and a sheet-shaped mold were produced in the same manner as Example 1 except that the cellulose nonwoven fabric was used. The composite sheet had an average thickness of 87 μm. The sheet-shaped mold weighed 0.026 g and had an average thickness of 114 μm.

Example 3

A cellulose nonwoven fabric having a basis weight of 10 g/m² was produced by the same paper production as Example 1 except that a refined product (average fiber diameter: 5 μm) obtained in the same manner as Example 1 (Preparation of cellulose fiber) was used as a fine cellulose fiber. The cellulose nonwoven fabric had an average thickness of 40 μm. A composite sheet and a sheet-shaped mold were produced in the same manner as Example 1 except that the cellulose nonwoven fabric was used. The composite sheet had an average thickness of 95 μm. The sheet-shaped mold weighed 0.032 g and had an average thickness of 145

Example 4

A composite sheet was produced in the same manner as Example 1 except that a cellulose nonwoven fabric subjected to a hydrophobization treatment was used as a cellulose nonwoven fabric. The composite sheet had an average thickness of 75 μm. The hydrophobization treatment was carried out as follows. A silane coupling agent (vinyltrimethoxysilane, "KBM-1003" manufactured by Shin-Etsu Chemical Co., Ltd.) as a hydrophobizing agent was dissolved in isopropanol to prepare a solution having a silane coupling agent concentration of 1% by weight. In the preparation of cellulose nonwoven fabric, a cellulose nonwoven fabric obtained was spray-coated with the solution so that the whole nonwoven fabric was fully wet with the solution, and then the nonwoven fabric was dried at 110° C. for 5 minutes.

Then, a sheet-shaped mold was obtained in the same manner as Example 1 except that the composite sheet was used. The sheet-shaped mold weighed 0.022 g and had an average thickness of 98 μm.

Example 5

A composite sheet and a sheet-shaped mold were produced in the same manner as Example 4 except that the cellulose nonwoven fabric had an average thickness of 100 μm. The composite sheet had an average thickness of 158 μm. The sheet-shaped mold weighed 0.035 g and had an average thickness of 185 μm.

Example 6

A water dispersion of a fine cellulose fiber obtained in the same manner as Example 1 (Preparation of cellulose fiber) was dispersed in acetone. The dispersing operation (dehydration) was repeated twice, and an acetone dispersion was obtained. To the acetone dispersion was added a silane coupling agent (KBM-1003) in a ratio of 0.5 parts by weight relative to 100 parts by weight of the fine cellulose fiber to give an acetone dispersion of the fine cellulose fiber having a solid content of 10% by weight.

A liquid silicone rubber (X-32-3212), a curing agent (CX-32-3212), acetone, and the resulting fine cellulose fiber dispersion were mixed in a ratio (weight ratio) of the liquid silicone rubber/the curing agent/acetone/the fine cellulose fiber dispersion of 10/1/5/5 to prepare a liquid silicone rubber composition containing the fine cellulose fiber.

A space (fluid reservoir) surrounded on all four sides with a polytetrafluoroethylene sheet (Teflon (registered trademark) sheet) 200 μm thick was formed on a glass plate. The above-mentioned composition was poured into the space and allowed to stand at 23° C. for 24 hours, and then allowed to stand at 150° C. over 2 hours for curing. The resulting composite sheet had an average thickness of 97 μm.

Then, a sheet-shaped mold (a sheet-shaped mold also containing a fiber in an uneven pattern thereof) was obtained in the same manner as Example 1 except that the resulting composite sheet and the liquid silicone rubber composition containing the fine cellulose fiber were used. The sheet-shaped mold weighed 0.025 g and had an average thickness of 115 μm.

Comparative Example 1

A sheet-shaped mold was obtained in the same manner as Example 1 except that the liquid silicone rubber composition alone was poured into the aluminum flame 50 mm square without a cellulose nonwoven fabric to give a resin sheet having an average thickness of 100 μm and that the resulting resin sheet was used instead of the composite sheet. The sheet-shaped mold weighed 0.031 g and had an average thickness of 127 μm.

Comparative Example 2

A sheet-shaped mold was obtained in the same manner as Example 1 except that the liquid silicone rubber composition alone was poured into the aluminum flame 50 mm square without a cellulose nonwoven fabric to give a resin sheet having an average thickness of 1 mm and that the resulting resin sheet was used instead of the composite sheet. The sheet-shaped mold weighed 0.243 g and had an average thickness of 1027 μm.

Comparative Example 3

A composite sheet was produced in the same manner as Example 1 except that a polypropylene porous film having an average thickness of 30 μm ("CELGARD 2500" manufactured by Polypore K.K.) was used instead of the cellulose nonwoven fabric. The composite sheet had an average thickness of 88 μm. Then, a sheet-shaped mold was obtained in the same manner as Example 1 except that the resulting composite sheet was used. The sheet-shaped mold weighed 0.024 g and had an average thickness of 105 μm Comparative Example 4

A composite sheet was produced in the same manner as Example 1 except that a silicone potting gel ("TSE3051" manufactured by Momentive Performance Materials Japan LLC) as a liquid silicone rubber composition. The average thickness of the composite sheet could not be measured accurately because the composite sheet had too low a film strength (the composite sheet had too soft a resin portion). The composite sheet had an average thickness of roughly 130 μm.

Table 1 shows the evaluation of the sheet-shaped molds obtained in Examples and Comparative Examples.

TABLE 1

| | | Cellulose fiber | Modulus of elasticity in tension (MPa) | Handleability | UV curability | Transfer characteristic | Continuous transfer characteristic |
|---|---|---|---|---|---|---|---|
| Examples | 1 | Nanofiber | 8.3 | 100 times or more | A | B | A |
| | 2 | KY-100G | 6.2 | 100 times or more | A | B | A |
| | 3 | Refined product | 4.8 | 100 times or more | B | B | A |
| | 4 | Nanofiber + silane coupling agent | 9.2 | 100 times or more | A | B | A |
| | 5 | Nanofiber + silane coupling agent (100 μm) | 12.4 | 100 times or more | B | B | A |
| | 6 | Nanofiber + silane coupling agent (mix) | 9.3 | 100 times or more | A | B | A |
| Comparative Examples | 1 | — (PDMS 100 μm) | 2.2 | 0 times | A | C | B |
| | 2 | — (PDMS 1 mm) | 2.5 | 21 times | A | C | B |
| | 3 | Polypropylene | 49 | 100 times or more | C | C | B |
| | 4 | Nanofiber (potting gel) | 7.0 | 0 times | B | — | — |

As apparent from the results shown in Table 1, the sheet-shaped molds of Examples have a high modulus of elasticity in tension, an excellent transfer characteristic, and an excellent continuous transfer characteristic. In contrast, the sheet-shaped molds of Comparative Examples 1 and 2 have a low modulus of elasticity in tension and are difficult to subject to continuous transfer. The sheet-shaped mold of Comparative Example 3 has a low UV resin curability and a low transfer characteristic. Although the composite sheet of Comparative Example 4 had a modulus of elasticity in tension of 7.0 MPa, the resin portion was too soft to handle. Thus a sheet-shaped mold could not be produced.

Examples 7 to 21

Composite sheets were produced in the same manner as Example 1 except that the thickness of the cellulose nonwoven fabric and the weights (solid content weights) of the silicone rubber (PDMS), the cellulose nonwoven fabric, and the composite sheet were changed (or adjusted) as those described in Table 2.

Table 2 shows a stress at break of each composite sheet obtained in Examples 7 to 21. Table 2 also shows a stress at break of each composite sheet obtained in Examples 1 to 5 as well as the thickness and weight of each composite sheet and the weight of the component.

TABLE 2

|  | Thickness of cellulose nonwoven fabric (μm) | Thickness of composite sheet (μm) | Weight of composite sheet (g) | Weight of PDMS (g) | Weight of cellulose nonwoven fabric (g) | Weight ratio of PDMS/cellulose nonwoven fabric | Stress at break (MPa) |
|---|---|---|---|---|---|---|---|
| Example 1 | 22 | 73 | 0.43 | 0.38 | 0.046 | 8.3 | 7.7 |
| Example 2 | 34 | 87 | 0.50 | 0.43 | 0.070 | 6.1 | 10.0 |
| Example 3 | 40 | 95 | 0.54 | 0.46 | 0.083 | 5.6 | 10.8 |
| Example 4 | 22 | 75 | 0.44 | 0.39 | 0.046 | 8.6 | 7.5 |
| Example 5 | 100 | 158 | 0.87 | 0.67 | 0.20 | 3.2 | 17.1 |
| Example 7 | 135 | 336 | 2.01 | 1.74 | 0.28 | 6.3 | 9.3 |
| Example 8 | 128 | 626 | 3.63 | 3.36 | 0.27 | 12.5 | 5.6 |
| Example 9 | 130 | 730 | 4.38 | 4.11 | 0.27 | 15.1 | 4.6 |
| Example 10 | 126 | 974 | 5.71 | 5.44 | 0.27 | 20.5 | 4.1 |
| Example 11 | 62 | 247 | 1.52 | 1.39 | 0.13 | 10.9 | 7.1 |
| Example 12 | 63 | 383 | 2.45 | 2.33 | 0.13 | 18.0 | 4.5 |
| Example 13 | 245 | 390 | 2.16 | 1.66 | 0.50 | 3.3 | 13.3 |
| Example 14 | 247 | 502 | 2.89 | 2.39 | 0.51 | 4.7 | 11.4 |
| Example 15 | 242 | 1075 | 6.03 | 5.53 | 0.50 | 11.0 | 6.7 |
| Example 16 | 250 | 1352 | 7.58 | 7.07 | 0.51 | 14.0 | 5.5 |
| Example 17 | 253 | 1522 | 8.56 | 8.06 | 0.51 | 15.8 | 4.8 |
| Example 18 | 129 | 2248 | 13.1 | 12.9 | 0.27 | 47.6 | 1.5 |
| Example 19 | 60 | 846 | 5.30 | 5.18 | 0.13 | 40.7 | 2.2 |
| Example 20 | 63 | 1778 | 11.0 | 10.9 | 0.13 | 83.8 | 1.0 |
| Example 21 | 59 | 2394 | 14.9 | 14.8 | 0.13 | 117.2 | 0.8 |

Figure 1:
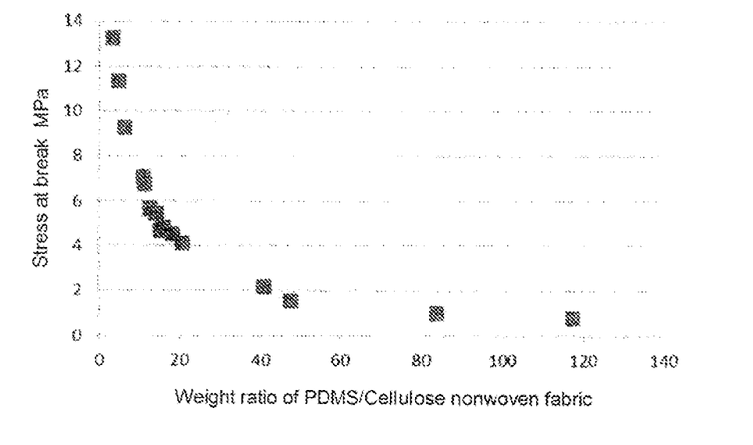
FIG. 1 is a graph showing a stress at break with respect to a weight ratio of silicone rubber (PDMS)/cellulose nonwoven fabric of composite sheets obtained in Examples.

Based on the results shown in Table 2, FIG. 1 graphically represents a relation between the weight ratio of the PDMS/the cellulose nonwoven fabric and the stress at break.

As apparent from Table 2 and FIG. 1, the stress at break increases as the weight ratio of the PDMS/the cellulose nonwoven fabric is lower. When the weight ratio of the PDMS/the cellulose nonwoven fabric was around 20 or less, the stress at break was increased sharply.

In these Examples, since air bubbles contained in the cellulose nonwoven fabric was leaked out of the surface of the fabric during the step of preparing the composite sheet, the composite sheet had a slightly low surface smoothness. Thus, a cellulose nonwoven fabric having a thickness of 120 μm and a liquid silicone rubber composition were prepared according to Example 1, and then a composite sheet was prepared according to each of Examples 22 to 24.

Example 22 (Pressure Impregnation Method)

In order to adjust a composite sheet to a desired thickness, the following procedure was conducted. A cellulose nonwoven fabric (thickness: 120 μm) was put in a glass petri dish having an opening of 90 mmϕ, and a liquid silicone rubber composition was put in the petri dish. Then the petri dish was placed in a stainless-steel pressurizer, pressurized to 3 MPa with nitrogen, and allowed to stand at 23° C. for 24 hours for impregnation of the cellulose nonwoven fabric with the liquid silicone rubber composition and curing. Then the petri dish was removed from the pressurizer and subjected to a curing treatment at 150° C. over one hour. The resulting composite sheet had an average thickness of 243 μm and had no decrease in surface smoothness due to air bubbles.

Example 23 (Roller Method)

A cellulose nonwoven fabric (thickness: 120 μm) was put in a glass petri dish having an opening of 90 mmϕ. A liquid silicone rubber composition was put in the petri dish and allowed to stand at 23° C. for one hour to impregnate the cellulose nonwoven fabric with the liquid silicone rubber composition. Then the cellulose nonwoven fabric was removed from the petri dish and held between polyimide films. Thereafter, the excess resin was removed from the fabric by a bi-axial rubber roller (manufactured by KUMAGAI RIKI KOGYO, LTD.). The fabric was allowed to stand at 23° C. for 23 hours for curing. The resulting cured product was removed from the polyimide films and subjected to a curing treatment at 150° C. over one hour. The resulting composite sheet had an average thickness of 235 μm and had no decrease in surface smoothness due to air bubbles.

Example 24 (Hot Pressing Method)

A cellulose nonwoven fabric (thickness: 120 μm) was put in a glass petri dish having an opening of 90 mmϕ. A liquid silicone rubber composition was put in the petri dish and allowed to stand at 23° C. for one hour to impregnate the cellulose nonwoven fabric with the liquid silicone rubber composition. Then the cellulose nonwoven fabric was removed from the petri dish and held between polyimide films. The polyimide films were held at a pressure of 0.1 MPa by a hot press, and the excess resin was removed from the fabric. Then the fabric was allowed to stand at 23° C. for 23 hours for curing. Finally, the fabric was subjected to a curing treatment at 150° C. over one hour with the polyimide films held by the hot press. The resulting composite sheet had an average thickness of 233 μm had no decrease in surface smoothness due to air bubbles.

Example 25 (Preparation of Resin for Master Mold)

At a room temperature (25° C.), 100 parts by weight of an epoxy resin ("EHPE3150" manufactured by Daicel Corporation) as a photocationic polymerizable compound, 6 parts by weight of a photocationic polymerization initiator ("CPI-300K" manufactured by San-Apro Ltd.), 1 part by weight of an antioxidant ("CHINOX1010" manufactured by Double Bond Chemical Ind. Co., Ltd.), 1 part by weight of a stabilizer ("HP-10" manufactured by ADEKA CORPORA- TION), and 270 parts by weight of propylene glycol methyl ether acetate ("MMPGAC" manufactured by Daicel Corporation) were stirred for dissolving each component uniformly to give a liquid photo-curable composition (a resin for master mold) at a room temperature.

(Production of Master Mold)

The resulting resin for master mold was applied on a Ni substrate of 1 m by 1 m so that the resin had a thickness of 5 μm. Thereafter, the coated substrate was heated at 90° C. for 5 minutes for solvent removal to give a resin layer for master mold. A mold of 5 cm by 5 cm having an uneven pattern (made of nickel (Ni), each width of dent and bump: 500 nm, height of bump: 500 nm) was fixed on an imprinting apparatus and pressed against the resulting resin layer for master mold at 10 MPa for 60 seconds, and the nickel mold was released. In the same way, the transfer treatment on the resin layer for master mold by the nickel mold was repeated so that the pattern was transferred on the whole surface of the resin layer of 1 m by 1 m. Then the resin layer was irradiated with UV rays (365 nm, 100 mW/cm$^2$, 300 seconds) and heated at 90° C. for 10 minutes to give a pattern-transferred product (master mold) of 1 m by 1 m.

(Preparation of Sheet-Shaped Mold)

A cellulose nonwoven fabric having 1.5 mφ and a basis weight of 10 g/m$^2$ was produced in the same manner as Example 1. The cellulose nonwoven fabric had an average thickness of 22 μm. The cellulose nonwoven fabric was cut to 1 m square, and the fabric was strained and fixed on an aluminum flame having an opening of 1 m square. The liquid silicone rubber composition was impregnated and cured in the same manner as Example 1, and a composite sheet was produced. The composite sheet had an average thickness of 73 vim.

The master mold having the uneven pattern (each width of dent and bump: 500 nm, height of bump: 500 nm) was fixed on an aluminum flame 1 m square. The liquid silicone rubber composition was poured, cured, and released in the same manner as Example 1, and a sheet-shaped mold was obtained. The sheet-shaped mold weighed 20.68 g and had an average thickness of 100 μm.

(Pattern Transfer)

The resin for imprint, which was the same as the resin used for evaluation of transfer characteristic, was applied on a water glass 1 m square and dried at 90° C. for 5 minutes in an oven to give a resin layer for imprint having a thickness of 2 vim.

Then, the resulting sheet-shaped mold was disposed to an imprinting apparatus so that the uneven pattern faced downward, and the upper surface of the sheet-shaped mold was adsorbed on the imprinting apparatus by vacuum suction from the adsorption surface of the imprinting apparatus. The sheet-shaped mold was held on the adsorption surface of the imprinting apparatus without sagging.

Subsequently, the uneven pattern of the sheet-shaped mold was pressed against the resin layer for imprint at 0.1 MPa for 60 seconds, and then subjected to UV irradiation (irradiation conditions: 2=365 nm, 100 mW/cm$^2$, 60 seconds) for curing the resin layer for imprint.

Thereafter, the resin layer for imprint was removed from the imprinting apparatus and released from the sheet-shaped mold, and transfer of the uneven pattern on the resin layer for imprint was observed. At that time, separation of the silicone rubber from the sheet-shaped mold was not observed.

Further, although the same pattern transfer was repeated 100 times, deterioration of the uneven pattern in the sheet-shaped mold or separation of the silicone rubber was not observed.

Comparative Example 5

The liquid silicone rubber composition alone was poured into an aluminum flame 1 m square without use of a cellulose nonwoven fabric to give a resin sheet having an average thickness of 75 μm.

Then, a sheet-shaped mold was obtained in the same manner as Example 25 except that the resulting resin sheet was used instead of the composite sheet. The sheet-shaped mold weighed 12.36 g and had an average thickness of 103 μm.

(Pattern Transfer)

Although the resulting sheet-shaped mold was adsorbed on the adsorption surface of the imprinting apparatus in the same manner as Example 25, the sag of the sheet-shaped mold was observed.

Subsequently, the uneven pattern was transferred on the resin layer for imprint in the same manner as Example 25. Defective uneven patterns due to the sag of the sheet-shaped mold were observed in the uneven pattern of the resin layer for imprint. Moreover, when the sheet-shaped mold was released, cracks of the sheet-shaped mold were observed.

INDUSTRIAL APPLICABILITY

The sheet-shaped mold of the present invention is utilizable for production processes in the optical or semiconductor field. For example, the sheet-shaped mold is useful for various patterning techniques, such as soft lithography, capillary force lithography, and imprint lithography.

The invention claimed is:

1. A sheet-shaped mold for imprint lithography using a photo-curable resin,
    wherein the sheet-shaped mold comprises:
    a cured silicone rubber containing a polyorganosiloxane and
    a cellulose fiber for reinforcing the cured silicone rubber,
    wherein a ratio of the cured silicone rubber relative to 100 parts by weight of the cellulose fiber is 100 to 10,000 parts by weight, and
    wherein the sheet-shaped mold has an average thickness of 5 to 500 μm.

2. The sheet-shaped mold according to claim 1, wherein the cellulose fiber comprises a cellulose nanofiber.

3. The sheet-shaped mold according to claim 1, wherein the sheet-shaped mold has an uneven pattern on at least one surface thereof.

4. The sheet-shaped mold according to claim 1, wherein the cellulose fiber has been surface-treated with a hydrophobizing agent.

5. The sheet-shaped mold according to claim 1, wherein the cellulose fiber forms a nonwoven fabric, and the nonwoven fabric is impregnated with the cured silicone rubber.

6. The sheet-shaped mold according to claim 1, wherein the cured silicone rubber comprises a cured product of a two-component curable silicone rubber having a polydimethylsiloxane unit.

7. The sheet-shaped mold according to claim 3, wherein the uneven pattern comprises a bump and a dent, the bump has an average height of 50 nm to 100 μm, and the bump or the dent has a minimum width of 50 nm to 100 μm.

8. The A sheet-shaped mold according to claim 1, which is a mold for nanoimprint lithography using a photo-curable resin.

\* \* \* \* \*